US008284079B2

(12) United States Patent
Shih et al.

(10) Patent No.: US 8,284,079 B2

(45) Date of Patent: Oct. 9, 2012

(54) KEYBOARD MODULE

(75) Inventors: Po-Jen Shih, Taipei Hsien (TW); Shu-I Chen, Taipei Hsien (TW)

(73) Assignee: Giga-Byte Technology Co., Ltd., New Taipei (TW)

( * ) Notice: Subject to any disclaimer, the term of this patent is extended or adjusted under 35 U.S.C. 154(b) by 197 days.

(21) Appl. No.: 12/873,314

(22) Filed: Aug. 31, 2010

(65) Prior Publication Data

US 2012/0050077 A1 Mar. 1, 2012

(51) Int. Cl.
*H03M 11/00* (2006.01)

(52) U.S. Cl. ........................................... 341/22; 341/23

(58) Field of Classification Search .................... 341/20, 341/22, 23; 345/156, 168–170
See application file for complete search history.

(56) References Cited

U.S. PATENT DOCUMENTS 4,536,625 A * 8/1985 Bebie ............................ 200/5 A
4,736,411 A * 4/1988 Chan ............................. 379/368
2010/0203929 A1* 8/2010 Skagmo et al. ............ 455/575.1

* cited by examiner

*Primary Examiner* — Henry Choe
(74) *Attorney, Agent, or Firm* — Chun-Ming Shih

(57) ABSTRACT

A keyboard structure including a first cover, a second cover, a circuit board and a dirt-proof structure is provided. The circuit board is disposed between the first cover and the second cover, and the dirt-proof structure disposed between the circuit board and the first cover is assembled with the circuit board and the second cover.

9 Claims, 2 Drawing Sheets

KEYBOARD MODULE

BACKGROUND OF THE INVENTION

1. Field of the Invention

The invention relates to a keyboard structure and more particularly to a keyboard structure which can be cleaned easily.

2. Description of Related Art

The current keyboard structures have structures assembled by top and bottom covers. Accordingly, when the user wants to clean the dust and dirt inside the seams of the key caps of the keyboard structure, tools such as a screw driver has to be used for disassembling the top cover and the bottom cover that are fixed together. The cleaning of the keyboard structure is thus inconvenient to the user. In addition, after the top cover and the bottom cover are disassembled, components of the keyboard structure are scattered as they are no longer structurally connected.

SUMMARY OF THE INVENTION

The invention is directed to a keyboard structure that can be cleaned easily.

The invention is directed to a keyboard structure including a first cover, a second cover, a circuit board and a dirt-proof structure. The circuit board is disposed between the first cover and the second cover. The dirt-proof structure disposed between the circuit board and the first cover is assembled with the circuit board and the second cover.

In one embodiment of the keyboard structure of the invention, the dirt-proof structure is a partition or a thin film.

In one embodiment of the keyboard structure of the invention, an edge of the dirt-proof structure covers an edge of the circuit board.

In one embodiment of the keyboard structure of the invention, the second cover has a drain hole, so that water infiltrated into the second cover is drained through the drain hole.

In one embodiment of the keyboard structure of the invention, the keyboard structure further includes at least one fixing element, the second cover has at least one positioning pillar, and the at least one fixing element penetrates the dirt-proof structure and the circuit board so as to be fixed to the at least one positioning pillar.

In one embodiment of the keyboard structure of the invention, the keyboard structure further includes a plurality of key caps disposed on the dirt-proof structure and located at the first cover, and portions of the dirt-proof structure located under the key caps further protrude toward the key caps.

In light of the foregoing, the cleaning of the keyboard structure of the invention can be carried out by directly disassembling the first cover. At this time, the circuit board, the dirt-proof structure and the second cover still remain as an intact assembled body.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
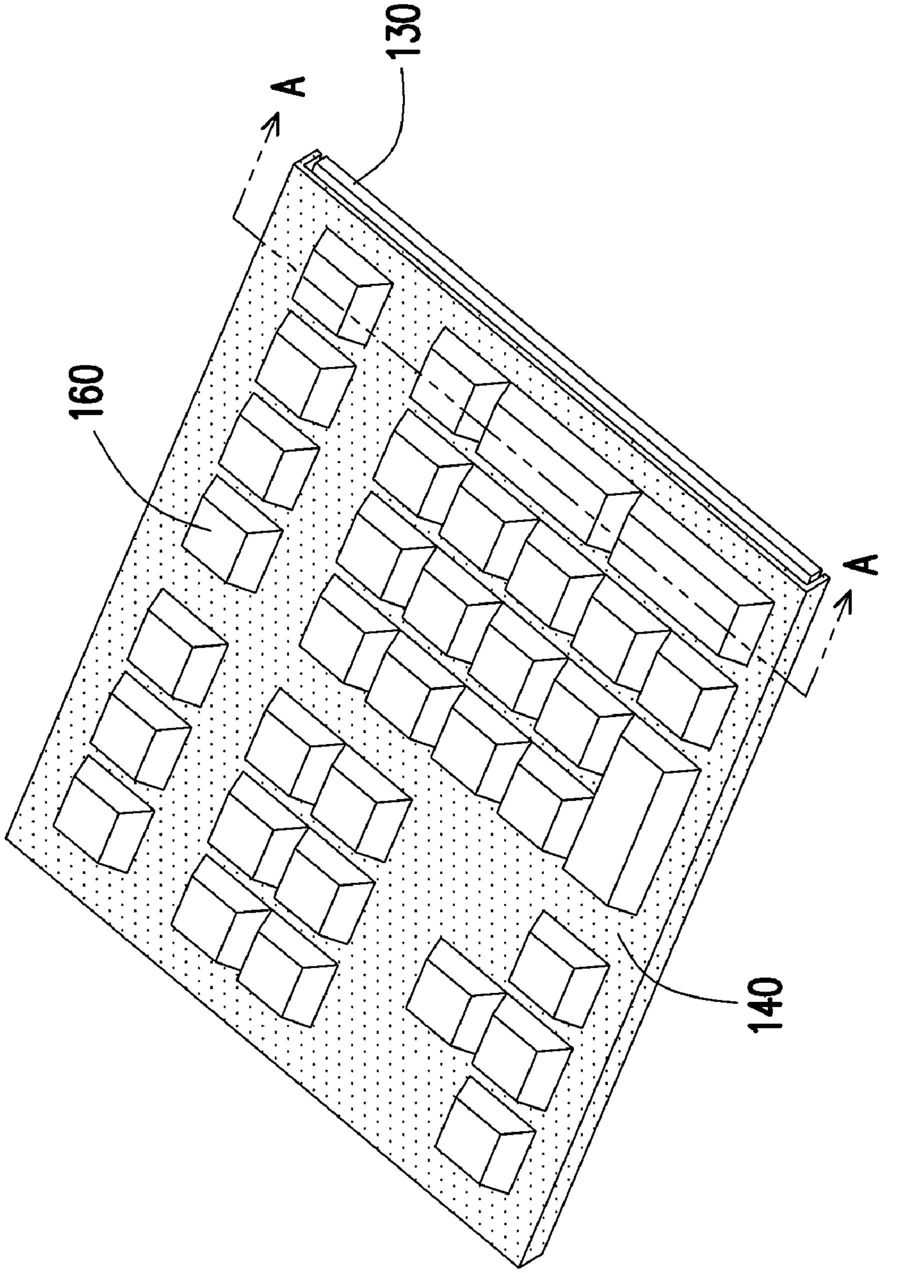
FIG. 1 illustrates a schematic view of a keyboard structure according to an embodiment of the invention.
Figure 2:
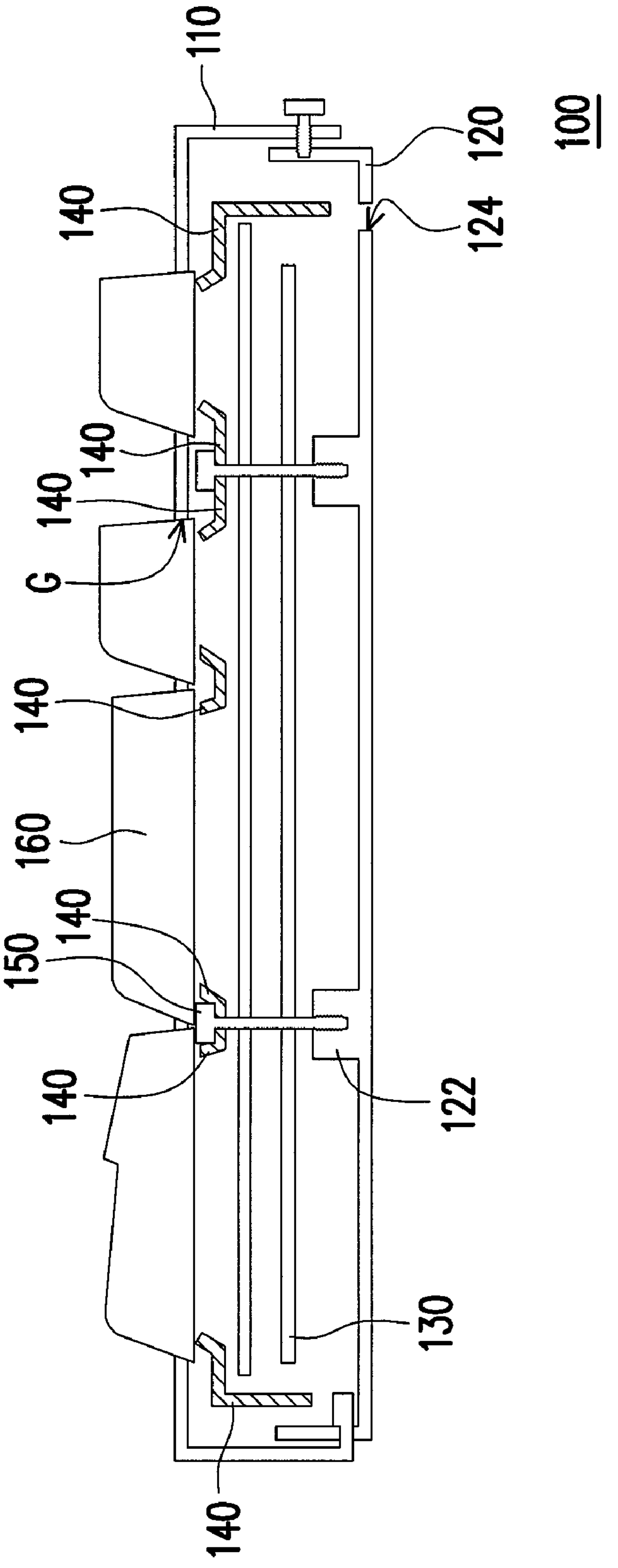
FIG. 2 illustrates a cross-sectional schematic diagram of FIG. 1A along line A-A.

FIG. 1 illustrates a schematic view of a keyboard structure according to an embodiment of the invention, and FIG. 2 illustrates a cross-sectional schematic diagram of FIG. 1A along line A-A, wherein the first cover 110 and the second cover 120 are not illustrated in FIG. 1. Referring to FIG. 1 and FIG. 2, a keyboard structure 100 of the present embodiment includes a first cover 110, a second cover 120, a circuit board 130, and a dirt-proof structure 140. The circuit board 130 is disposed between the first cover 110 and the second cover 120. The dirt-proof structure 140 is disposed between the circuit board 130 and the first cover 110. Moreover, the dirt-proof structure 140 is assembled with the circuit board 130 and the second cover 120.

Accordingly, the first cover 110 and the second cover 120 of the present embodiment are fabricated using plastic or metal depending on the demands. The first cover 110 and the second cover 120 can be assembled in different manners such as fixing with screws, engaging with hooks and slots, or close fitting of complementary shapes. Here, the circuit board 130 and the dirt-proof structure 140 are disposed in a space formed after the assembly of the first cover 110 and the second cover 120. The dirt-proof structure 140 is a partition disposed on the circuit board 130. The circuit board 130 is a conventional non-flexible multi-layer board or a thin film circuit board. In other embodiments, the dirt-proof structure 140 is a thin film, where this thin film is adhered to the circuit board 130 directly. Further, an edge of the dirt-proof structure 140 can extend to cover an edge of the circuit board 130 so as to prevent dust or dirt entering the circuit board 130 from the side of the circuit board 130. Accordingly, the keyboard structure 100 further includes at least one fixing element 150 (two fixing elements 150 are illustrated in the figure). The second cover 120 has at least one positioning pillar 122 (two positioning pillars 122 are illustrated in the figure). Moreover, each fixing element 150 is, for example, a screw penetrating through the dirt-proof structure 140 and the circuit board 130 to be fixed to the positioning pillar 122. Consequently, the dirt-proof structure 140 is assembled with the circuit board 130 and the second cover 120.

In details, the keyboard structure 100 has a plurality of key caps 160 passing through the first cover 110. When using the keyboard structure 100, the user triggers switches on the circuit board 130 by pressing the key caps 160 so as to input instructions or words. Due to structural characteristics and assembling tolerance, a gap G is present between the key cap 160 and the first cover 110. Thus, when using conventional keyboard structures, dust accumulates in the gap G easily, or dust and water drops can easily fall on the circuit board 130 through the gap G. Especially, the dirt-proof structure 140 of the keyboard structure 100 in the present embodiment is directed installed on the circuit board 130, and portions of the dirt-proof structure 140 correspondingly under the key caps 160 protrude toward the key caps 160. Thus, when dust and water drops enter the space formed after the assembly of the first cover 110 and the second cover 120 through gap G, the dirt-proof structure 140 can effectively prevent dust or water drops from falling on the circuit board 130 due to the height of the portions to avoid short circuit or damages of the circuit board 130.

When the user intends to remove the dust or water drops accumulated in the gap G or the dirt-proof structure 140, the user can disassemble the first cover 110 from the second cover 120 for exposing the dirt-proof structure 140. In particular, the fixing elements 150 pass through the dirt-proof structure 140 and the circuit board 130 to be fixed to the positioning pillars 122 of the second cover 120. Therefore, when the first cover 110 is disassembled from the second cover 120, the dirt-proof structure 140, the circuit board 130, and the second cover 120 remain an intact assembly. Here, the user can then clean the surface of the dirt-proof structure 140 by vacuuming the dust or wiping the water drops, for instance. Comparing with the conventional art, in the keyboard structure 100 of the present embodiment, after the first cover 110 and the second cover 120 are disassembled, the dirt-proof structure 140, the circuit board 130, and the second cover 120 are not scattered, but remain an intact assembly. Consequently, the user does not need to re-assemble the first cover 110, the second cover 120, the circuit board 130, and the dirt-proof structure 140. That is, the keyboard structure 100 of the present embodiment is advantageous in easy disassembly, assembly, and cleaning.

Additionally, a drain hole 124 can be further disposed on the second cover 120, so that water infiltrated into the space formed by the first cover 110 and the second cover 120 is drained through the drain hole 124 of the second cover 120. Also, the edge of the dirt-proof structure 140 can have a trench (not shown), where the trench is configured to guide the water on the dirt-proof structure 140 and the position of the drain hole 124 is disposed corresponding to the trench.

In summary, the dirt-proof structure of the keyboard structure in the invention is disposed between the first cover and the circuit board. Therefore, the dirt-proof structure can be dust-proof and water-proof by preventing dust and water drops from falling on the circuit board. The dirt-proof structure is assembled with the circuit board and the second cover. Thus, when the user disassembles the first cover and the second cover, the dirt-proof structure, the circuit board, and the second cover are not scattered but remain as an assembly. Hence, after cleaning the dust accumulated in the seams of the key caps, the user only needs to re-assemble the first cover and the second cover for completing the assembly of the keyboard structure. The invention is thus convenient in assembly.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A keyboard structure, comprising:

a first cover;

a second cover;

a circuit board disposed between the first cover and the second cover;

a dirt-proof structure disposed between the circuit board and the first cover, and assembled with the circuit board and the second cover; and at least one fixing element, the second cover having at least one positioning pillar, and the at least one fixing element penetrating the dirt-proof structure and the circuit board so as to be fixed to the at least one positioning pillar.

2. The keyboard structure as claimed in claim 1, wherein the dirt-proof structure is a partition or a thin film.

3. The keyboard structure as claimed in claim 1, wherein an edge of the dirt-proof structure covers an edge of the circuit board.

4. The keyboard structure as claimed in claim 1, wherein the second cover has a drain hole, so that water infiltrated into the second cover is drained through the drain hole.

5. The keyboard structure as claimed in claim 1, further comprising a plurality of key caps, disposed on the dirt-proof structure and located at the first cover, and portions of the dirt-proof structure located under the key caps further protruding toward the key caps.

6. A keyboard structure, comprising:

a first cover;

a second cover;

a circuit board disposed between the first cover and the second cover;

a dirt-proof structure disposed between the circuit board and the first cover, and assembled with the circuit board and the second cover; and a plurality of key caps, disposed on the dirt-proof structure and located at the first cover, and portions of the dirt-proof structure located under the key caps further protruding toward the key caps.

7. The keyboard structure as claimed in claim 6, wherein the dirt-proof structure is a partition or a thin film.

8. The keyboard structure as claimed in claim 6, wherein an edge of the dirt-proof structure covers an edge of the circuit board.

9. The keyboard structure as claimed in claim 6, wherein the second cover has a drain hole, so that water infiltrated into the second cover is drained through the drain hole.

* * * * *